(12) United States Patent
Huizen et al.

(10) Patent No.: US 11,377,034 B2
(45) Date of Patent: Jul. 5, 2022

(54) INTERIOR REARVIEW MIRROR ASSEMBLY WITH FULL SCREEN VIDEO DISPLAY

(71) Applicant: Magna Mirrors of America, Inc., Holland, MI (US)

(72) Inventors: Gregory A. Huizen, Hudsonville, MI (US); Eric Peterson, West Olive, MI (US)

(73) Assignee: MAGNA MIRRORS OF AMERICA, INC., Holland, MI (US)

( * ) Notice: Subject to any disclaimer, the term of this patent is extended or adjusted under 35 U.S.C. 154(b) by 0 days.

(21) Appl. No.: 17/446,855

(22) Filed: Sep. 3, 2021

(65) Prior Publication Data

US 2022/0017015 A1 Jan. 20, 2022

Related U.S. Application Data

(63) Continuation of application No. 16/640,750, filed as application No. PCT/US2018/047675 on Aug. 23, 2018, now Pat. No. 11,110,864.
(Continued)

(51) Int. Cl.
*B60R 1/12* (2006.01)
*B60K 35/00* (2006.01)
(Continued)

(52) U.S. Cl.
CPC ............... *B60R 1/12* (2013.01); *B60K 35/00* (2013.01); *B60R 1/04* (2013.01); *H01L 25/0753* (2013.01);
(Continued)

(58) Field of Classification Search
CPC ...... B60R 1/12; B60R 1/02; B60R 2001/1215
See application file for complete search history.

(56) References Cited

U.S. PATENT DOCUMENTS

| 1,949,138 A | 2/1934 | Bell |
| 5,497,305 A | 3/1996 | Pastrick et al. |

(Continued)

FOREIGN PATENT DOCUMENTS

WO    WO-2007053710 A2 *   5/2007   .........   B29C 45/0017

OTHER PUBLICATIONS

International Search Report and Written Opinion dated Oct. 18, 2018 from corresponding PCT Application No. PCT/US2018/047675.

*Primary Examiner* — Gerald Johnson
(74) *Attorney, Agent, or Firm* — Honigman LLP

(57) ABSTRACT

A vehicular interior rearview mirror assembly includes a mirror head pivotable about a mirror support, which is configured to attach at an interior portion of a vehicle. The mirror head includes a mirror casing and a mirror reflective element having a transflective mirror reflector that at least partially reflects light incident thereon and at least partially transmits incident light therethrough. A video display device is disposed behind a reflective region of the mirror reflective element and includes a display screen backlit by a backlighting device, which includes a plurality of micro-LEDs disposed at electrically conductive traces of a flexible circuit element. With the mirror support attached at the interior portion of the vehicle, the video display device is operable to display video images captured by a camera of the vehicle, whereby light emitted by the video display device passes through the mirror reflective element for viewing displayed video images.

35 Claims, 6 Drawing Sheets

Related U.S. Application Data

(60) Provisional application No. 62/549,101, filed on Aug. 23, 2017.

(51) Int. Cl.
*B60R 1/04* (2006.01)
*H01L 25/075* (2006.01)

(52) U.S. Cl.
CPC ............. *B60K 2370/1523* (2019.05); *B60K 2370/1533* (2019.05); *B60K 2370/23* (2019.05); *B60K 2370/332* (2019.05); *B60K 2370/779* (2019.05); *B60R 2001/1215* (2013.01); *B60R 2300/8046* (2013.01)

(56) References Cited

U.S. PATENT DOCUMENTS

| | | |
|---|---|---|
| 5,668,663 A | 9/1997 | Varaprasad et al. |
| 5,671,996 A | 9/1997 | Bos et al. |
| 5,938,321 A | 8/1999 | Bos et al. |
| 6,086,229 A | 7/2000 | Pastrick |
| 6,139,172 A | 10/2000 | Bos et al. |
| 6,149,287 A | 11/2000 | Pastrick et al. |
| 6,152,590 A | 11/2000 | Furst et al. |
| 6,176,602 B1 | 1/2001 | Pastrick et al. |
| 6,276,821 B1 | 8/2001 | Pastrick et al. |
| 6,280,069 B1 | 8/2001 | Pastrick et al. |
| 6,416,208 B2 | 7/2002 | Pastrick et al. |
| 6,445,287 B1 | 9/2002 | Schofield et al. |
| 6,568,839 B1 | 5/2003 | Pastrick et al. |
| 6,690,268 B2 | 2/2004 | Schofield et al. |
| 6,919,796 B2 | 7/2005 | Boddy et al. |
| 7,195,381 B2 | 3/2007 | Lynam et al. |
| 7,255,451 B2 | 8/2007 | McCabe et al. |
| 7,289,037 B2 | 10/2007 | Uken et al. |
| 7,338,177 B2 | 3/2008 | Lynam |
| 7,360,932 B2 | 4/2008 | Uken et al. |
| 7,581,859 B2 | 9/2009 | Lynam |
| 7,855,755 B2 | 12/2010 | Weller et al. |
| 7,944,371 B2 | 5/2011 | Foote et al. |
| 8,049,640 B2 | 11/2011 | Uken et al. |
| 8,058,977 B2 | 11/2011 | Lynam |
| 8,142,059 B2 | 3/2012 | Higgins-Luthman et al. |
| 8,277,059 B2 | 10/2012 | McCabe et al. |
| 8,333,492 B2 | 12/2012 | Dingman et al. |
| 8,367,844 B2 | 2/2013 | Sulzer-Mosse et al. |
| 8,376,595 B2 | 2/2013 | Higgins-Luthman |
| 8,508,831 B2 | 8/2013 | De Wind et al. |
| 8,529,108 B2 | 9/2013 | Uken et al. |
| 8,696,179 B2 | 4/2014 | Pastrick |
| 8,730,553 B2 | 5/2014 | De Wind et al. |
| 8,764,256 B2 | 7/2014 | Foote et al. |
| 8,786,401 B2 | 7/2014 | Sobecki et al. |
| 9,041,806 B2 | 5/2015 | Baur et al. |
| 9,057,875 B2 | 6/2015 | Fish, Jr. et al. |
| 9,126,525 B2 | 9/2015 | Lynam et al. |
| 9,174,578 B2 | 11/2015 | Uken et al. |
| 9,205,780 B2 | 12/2015 | Habibi et al. |
| 9,280,202 B2 | 3/2016 | Gieseke et al. |
| 9,290,970 B2 | 3/2016 | De Wind et al. |
| 9,346,403 B2 | 5/2016 | Uken et al. |
| 9,487,144 B2 | 11/2016 | Blank et al. |
| 9,598,016 B2 | 3/2017 | Blank et al. |
| 9,659,498 B2 | 5/2017 | Kendall et al. |
| 9,762,880 B2 | 9/2017 | Pflug |
| 9,834,153 B2 | 12/2017 | Gupta et al. |
| 9,900,522 B2 | 2/2018 | Lu |
| 10,046,706 B2 | 8/2018 | Larson et al. |
| 10,421,404 B2 | 9/2019 | Larson et al. |
| 10,442,360 B2 | 10/2019 | LaCross et al. |
| 11,110,864 B2 | 9/2021 | Huizen et al. |
| 2005/0195488 A1 | 9/2005 | McCabe et al. |
| 2008/0211735 A1 | 9/2008 | Balcerzak et al. |
| 2009/0015736 A1 | 1/2009 | Weller et al. |
| 2009/0296190 A1 | 12/2009 | Anderson et al. |
| 2010/0097469 A1 | 4/2010 | Blank et al. |
| 2010/0165437 A1 | 7/2010 | Tonar et al. |
| 2012/0162427 A1 | 6/2012 | Lynam |
| 2013/0300294 A1 | 11/2013 | Jungwirth |
| 2014/0022390 A1 | 1/2014 | Blank et al. |
| 2014/0175481 A1 | 6/2014 | Tischler |
| 2014/0332828 A1 | 11/2014 | Hasenoehr et al. |
| 2014/0340510 A1 | 11/2014 | Ihlenburg et al. |
| 2014/0347488 A1 | 11/2014 | Tazaki et al. |
| 2015/0022664 A1 | 1/2015 | Pflug et al. |
| 2015/0232034 A1 | 8/2015 | Weller et al. |
| 2016/0082890 A1 | 3/2016 | Habibi et al. |
| 2016/0276195 A1 | 9/2016 | Huska et al. |
| 2016/0375833 A1 | 12/2016 | Larson et al. |
| 2017/0053901 A1 | 2/2017 | Huska et al. |
| 2017/0088055 A1 | 3/2017 | Cammenga et al. |
| 2017/0167703 A1 | 6/2017 | Cok |
| 2017/0217367 A1 | 8/2017 | Pflug et al. |
| 2017/0327044 A1 | 11/2017 | Baur |
| 2017/0355312 A1 | 12/2017 | Habibi et al. |
| 2018/0251069 A1 | 9/2018 | LaCross et al. |
| 2018/0348574 A1 | 12/2018 | Lin et al. |
| 2019/0146297 A1 | 5/2019 | Lynam et al. |

\* cited by examiner

US 11,377,034 B2

INTERIOR REARVIEW MIRROR ASSEMBLY WITH FULL SCREEN VIDEO DISPLAY

CROSS REFERENCE TO RELATED APPLICATIONS

The present application is a continuation of U.S. patent application Ser. No. 16/640,750, filed Feb. 21, 2020, now U.S. Pat. No. 11,110,864, which is a 371 national phase filing of PCT Application No. PCT/US2018/047675, filed Aug. 23, 2018, which claims the filing benefits of U.S. provisional application Ser. No. 62/549,101, filed Aug. 23, 2017, which is hereby incorporated herein by reference in its entirety.

FIELD OF THE INVENTION

The present invention relates generally to the field of interior rearview mirror assemblies for vehicles and, more particularly, to interior rearview mirror assemblies with a display.

BACKGROUND OF THE INVENTION

Use of light emitting diodes (LEDs) are known in automotive applications, including, for example, display screen backlighting or other interior or exterior lighting applications, such as described in U.S. Pat. Nos. 7,855,755; 7,338,177; 7,195,381 and/or 6,690,268, which are all hereby incorporated herein by reference in their entireties. Such applications can encounter challenges with lighting uniformity, cost, heat load, current draw and application.

SUMMARY OF THE INVENTION

The present invention provides improved vehicular lighting using micro-LEDS and provides improved LED backlighting for vehicular information display screens used to display the likes of video images and other information for viewing and use by a driver or occupant of an equipped vehicle. For example, the present invention provides an interior rearview mirror assembly that includes a mirror casing, a mirror reflective element and a display device disposed behind the mirror reflective element and operable to display information for viewing by the driver of the vehicle through the interior mirror reflective element. The interior mirror reflective element comprises a transflective mirror reflector whereby the mirror reflector reflects light that is incident on the reflective element and partially transmits illumination emitted from the display device through the mirror reflective element. The display screen or display area of the display device preferably encompasses or spans the height and width of the mirror reflective element and thus provides a full display mirror. The display device comprises a display screen (such as a thin film transistor (TFT) display screen) that is backlit by a plurality of micro light emitting diodes (micro-LEDs), which may be arranged in a two dimensional close-packed array on a flexible printed circuit substrate or on a rigid printed circuit substrate or on a flexible circuit substrate attached or laminated to a rigid substrate/stiffening element.

These and other objects, advantages, purposes and features of the present invention will become apparent upon review of the following specification in conjunction with the drawings.

DESCRIPTION OF THE PREFERRED EMBODIMENTS

Figure 1:
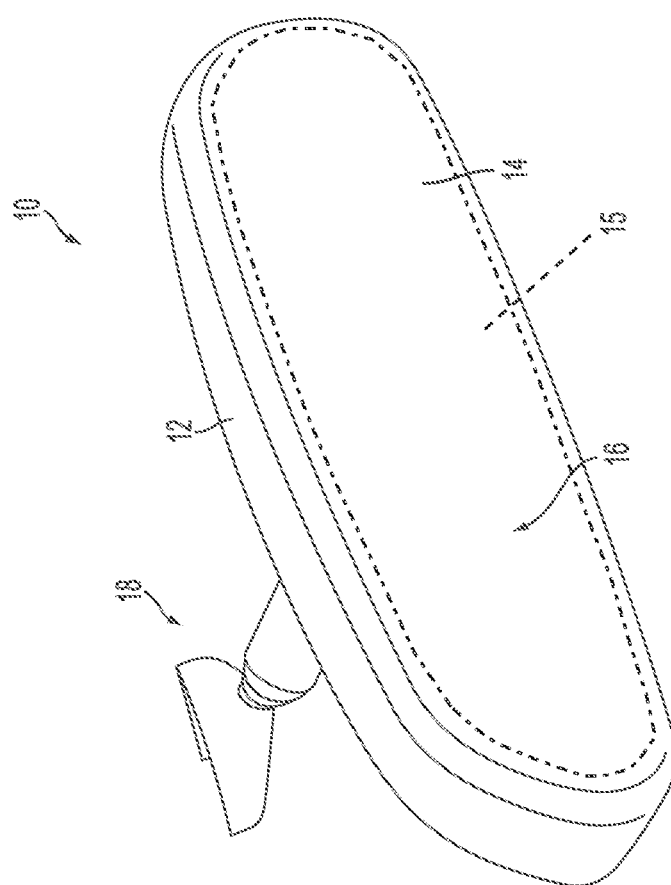
FIG. 1 is a perspective view of an interior rearview mirror assembly in accordance with the present invention.
Figure 2:
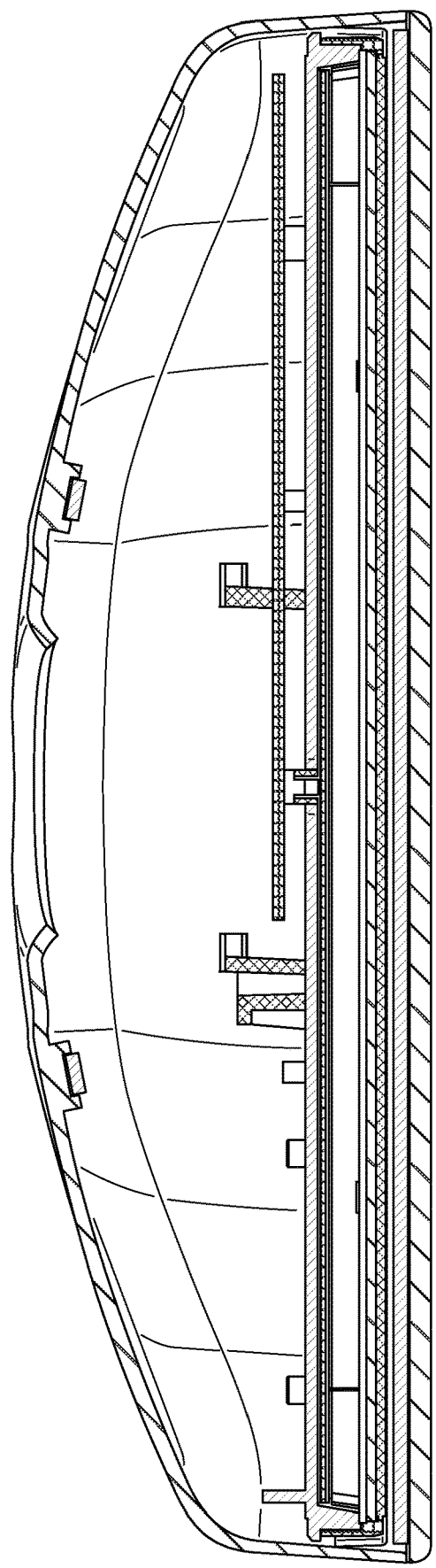
FIG. 2 is a sectional view of the interior rearview mirror assembly of FIG. 1.

Referring now to the drawings and the illustrative embodiments depicted therein, an interior rearview mirror assembly 10 for a vehicle includes a casing 12 that houses a reflective element 14 and a display device 16, which provides a display area 15 visible to the driver of the vehicle through the reflective element 14 (FIGS. 1 and 2). In the illustrated embodiment, the mirror assembly 10 is configured to be adjustably mounted to an interior portion of a vehicle (such as to an interior or in-cabin surface of a vehicle windshield or a headliner of a vehicle or the like) via a mounting structure or mounting configuration or assembly 18. The casing 12 of the interior rearview mirror assembly 10 may house all or a portion of the components of the interior rearview mirror assembly 10 and may be integrally formed with portions thereof.

The principal or main viewing area of the mirror reflector of the full display video mirror has the same or slightly better field of view of a typical interior rearview mirror (which typically has a minimum of about 20 degrees field of view). The video images shown to a driver of the vehicle viewing the video display screen of the interior rearview mirror are preferably at unit magnification and thus appear the same to the driver as would reflected images appear at a conventional interior rearview mirror. For example, the video mirror may be provided with a video feed of image data captured by a rearward viewing camera (such as by utilizing aspects of the systems described in U.S. Pat. No. 9,041,806, which is hereby incorporated herein by reference in its entirety). The video mirror may be constructed in accordance with the constructions described in U.S. Pat. Nos. 7,855,755 and/or 6,690,268, which are hereby incorporated herein by reference in their entireties.

The rearward viewing camera captures image data of a left end zone, a right end zone and a middle zone (between the left and right zones and rearward of the vehicle). The system displays the middle zone at the mirror video display screen at unit magnification, and may display images representative of the left and right end zones as wide angle views of the wings or regions rearward and to the respective sides of the equipped vehicle. The left and right end zones may be delineated by a divider overlay that is electronically generated and is superimposed on the real-time video images being displayed at the mirror video screen. Those end zones can display a wide-angle view so that a greater horizontal and/or vertical field of view can be seen. This would be similar to a convex or aspheric or "flat to bent" reflector.

In such a manner, the field of view, particularly provided by the end zones, can supplement and extend beyond the fields of view of the driver and passenger side exterior rearview mirrors at the driver and passenger sides of the vehicle to reduce/eliminate blind zones between the exterior rearview mirror(s) view and the interior rearview mirror view. Also, those end zones may have different display modes, such as, for example, a "trailering mode" or the like, where the end zones can show the edges of the road being travelled along by the equipped vehicle (with overlay of car edges or actual edges) or the edges of the traffic lane being travelled along by the equipped vehicle (with overlay of lane edges or actual edges) so at a glance the driver can see how the equipped vehicle is centered in the lane/on the road and the vehicle can be guided so the vehicle and the trailer are centered on the lane or road. Other cameras of the vehicle could feed image data to the system for a trailering situation, such as cameras mounted at the side of the equipped vehicle and preferably exterior mirror-mounted cameras used for the likes of birds-eye surround view features such as described in U.S. Pat. Nos. 9,900,522; 9,834,153; 9,762,880 and/or 9,126,525, and/or U.S. Publication Nos. US-2015-0022664; US-2014-0340510 and/or US-2012-0162427, which are all hereby incorporated herein by reference in their entireties. The display may include a "1:1 mode"/unit magnification that can turn off the dividers if that is annoying to some drivers. The mirror assembly and video display device may utilize aspects of the assemblies and devices described in U.S. Pat. No. 7,855,755 and/or U.S. Publication Nos. US-2017-0355312 and/or US-2016-0375833, and/or U.S. patent application Ser. No. 15/910,084, filed Mar. 2, 2018, and/or International Publication No. WO 2017/191558, which are all hereby incorporated herein by reference in their entireties.

The interior mirror reflective element 14 of the interior rearview mirror assembly 10 may comprise an electro-optic mirror reflective element (such as, for example, an electrochromic mirror reflective element) and the display device 16 is disposed at a rear surface of the electro-optic mirror reflective element for emitting illumination and displaying images and/or other information at the display area 15 through the mirror reflective element for viewing by a driver of the equipped vehicle who views the mirror reflective element. In the illustrated embodiment, the display area 15 encompasses substantially all of the reflective element 14, such that the display area 15 is substantially the same size as the visible reflective surface. For example, the display area 15 may occupy at least 75 percent of the area of the visible reflective surface of the reflective element (or the electro-optically active region of the reflective element), preferably at least 85 percent of the area of the visible reflective surface of the reflective element, and more preferably at least 95 percent of the area of the visible reflective surface of the reflective element. The display device 16 is disposed at the rear surface of the electro-optic mirror reflective element 14, with a mirror reflector film or layer disposed at the front surface of the rear substrate (commonly referred to as the third surface of the reflective element) and opposing an electro-optic medium, such as an electrochromic medium disposed between the front and rear substrates and bounded by a perimeter seal. Optionally, the mirror reflector could be disposed at the rear surface of the rear substrate (commonly referred to as the fourth surface of the reflective element), while remaining within the spirit and scope of the present invention.

The mirror reflector comprises a transflective mirror reflector and provides a substantially reflective layer at the display area 15, while being at least partially transmissive of light or illumination emitted by display device 16, as discussed below. The transflective mirror reflector is partially transmissive of visible light therethrough and partially reflective of visible light incident thereon and, thus, the presence of the video display device behind the reflective element is rendered covert by the transflective mirror reflector and information displayed by the video display device is only viewable through the mirror reflector and reflective element when the video display device is activated or backlit to display such images and/or information for viewing by the driver of the vehicle when the driver is normally operating the vehicle.

In the illustrated embodiment, the display device comprises a display module having a display screen (such as a multi-pixel LCD panel/screen backlit by a plurality of micro-LEDs) and a circuit element (such as a printed circuit board or the like, such as a silicon substrate having circuitry established thereon) disposed at the rear of the display screen. The circuit element or substrate has circuitry established thereat (such as by establishing the circuitry at or on a substrate using CMOS technology or the like), and such circuitry may be configured for controlling the display functions and/or for controlling the dimming or variable reflectance of the reflective element.

The display device 16 includes a substrate, with the circuitry associated with the display preferably disposed at a flexible printed circuit (FPC) on a flexible polymeric film, such as a PET (polyethylene terephthalate) or MYLAR or Polyimide film (alternatively, it can be on an FR4 rigid PCB or an aluminum-clad rigid substrate/board or copper-clad rigid substrate/board). The PET film (or other suitable material) may have a thickness of between around 75 microns and 200 microns, such as, for example, about 150 microns, and is flexible and at least partially conformable to curved surfaces/bodies. The circuitry includes display power supply components and display driver integrated circuit (IC) and other circuitry associated with powering and controlling or reconfiguring the display device. Optionally, the circuitry may be disposed at a flexible printed circuit board or at a rigid printed circuit board (such as, for example, at a flexible circuit board with or without a stiffener or stiffening element).

For example, the reflective element may have a front glass substrate and a rear glass substrate, with the front glass substrate extending downward (beyond a lower perimeter region of the rear glass substrate) so as to provide an overhang region at the lower portion of the reflective element at the central lower region of the display glass (such as by utilizing aspects of the mirror assemblies described in U.S. Pat. Nos. 7,255,451; 7,289,037; 7,360,932; 8,049,640; 8,277,059; 8,529,108; 8,508,831; 8,730,553; 9,174,578; 9,346,403 and/or 9,598,016, which are hereby incorporated herein by reference in their entireties). The reflective element is nested in the mirror housing or casing with the display device disposed behind the reflective element and in the mirror casing. The TFT connector may be routed below the FPC substrate and a heat sink and within the mirror casing, where it can be electrically connected to circuitry of the mirror assembly or to a wire harness or the like for electrically powering the video display device.

The display device comprises a micro-LED display device that includes a two dimensional close-packed array of micro-LEDs disposed at a circuit element or substrate or board. For example, the micro-LEDs may be disposed at a flexible circuit substrate or element (or at a rigid circuit board or element). Each micro-LED has a width or length dimension smaller than 500 microns and preferably has no width or length dimension smaller than 75 microns. For example, the micro-LEDs may comprise 100 micron×200 micron micro-LEDs, or may comprise 150 micron×300 micron micro-LEDs or may comprise 300×500 micron (or smaller) micro-LEDs, and may be disposed, for example, at 0.2 mm thick printed silver electrically-conducting traces on a circuit board or substrate (or optionally at copper traces on a flexible or rigid circuit board or substrate) or at wider or narrower electrically-conducting traces. Typically, small known non-micro LEDs are around 600 microns×1000 microns or larger.

The micro-LEDs may be disposed at the substrate at about 300 micron spacing (or smaller), which close packing provides greater brightness and more uniform brightness as compared to known non-micro LED displays. For example, the micro-LED array for video mirror reflective element 14 may comprise up to 1,600 micro-LEDs (or more) arranged at the circuit board or element or substrate. Using micro-LEDS, more than 1,300 micro-LEDs (such as, for example, 1,344 micro-LEDs) may be disposed at a circuit substrate having an area of around 8,500 mm$^2$. Such close-packed micro-LEDs function to eliminate lighting intensity hotspots and provide uniform lighting that may operate at a lower current draw (and hence less heat generation) and at a higher light output efficiency (Luminance per Watt). Packing density for the micro-LEDs is preferably at least 10 micro-LEDs per square centimeter of substrate surface area, more preferably at least 20 micro-LEDs per square centimeter of substrate surface area, and most preferably at least 30 micro-LEDs per square centimeter of substrate surface area. Use of the micro-LED display may also allow for reduced usage of diffuse and light directing films to further increase backlight transmission through mirror reflective element 14 by up to about 20 percent or more (with at least about a 20 percent reduction in heat generated by the backlighting when operating). The micro-LED display allows for parallel connection of the micro-LEDs and/or series connection of the micro-LEDs (or a combination of both) and provides uniform output intensity and color. The micro-LED display may comprise a flex polyimide carrier that folds around an aluminum core.

Suitable micro-LEDs are available from the likes of Seoul Semiconductor Company LTD (of Ansan, South Korea) or EPISTAR Corporation (of Taiwan), and may be established at a substrate using techniques developed by Rohinni LLC of Coeur d'Alene, Id. Such micro-LEDs may be put down or established or dot-printed as a blue die (3V forward voltage, 1.4 mA current typical), a red die (2V forward voltage, 1.5 mA current typical), and a green die (2V forward voltage, 1.5 mA current typical). All of the micro-LEDs may be powered together for backlighting the display screen. When red micro-LEDs and blue micro-LEDs and green micro-LEDs are used on the same substrate, all red micro-LEDs can be electrically powered and all blue micro-LEDs can be electrically powered separately and all green micro-LEDs can be electrically powered separately. Examples of micro-LEDs suitable for use in embodiments of this present invention are described in U.S. Publication Nos. US-2017-0053901 and/or US-2016-0276195, which are hereby incorporated herein by reference in their entireties. Current passed by each individual micro-LED when operated in embodiments of this present invention is preferably greater than 0.75 mA and less than 4 mA, more preferably is greater than 1 mA and less than 2.5 mA, and most preferably is greater than 1.25 mA and less than 1.75 mA.

Optionally, and desirably, the display screen of the video mirror reflective element 14 may be backlit by a plurality of blue die micro-LEDs, which may be overcoated with a phosphor conversion film, such as available from PhosphorTech Corporation of Kennesaw, Ga., such that the blue light phosphorizes in it and comes out as white light.

Figure 3:
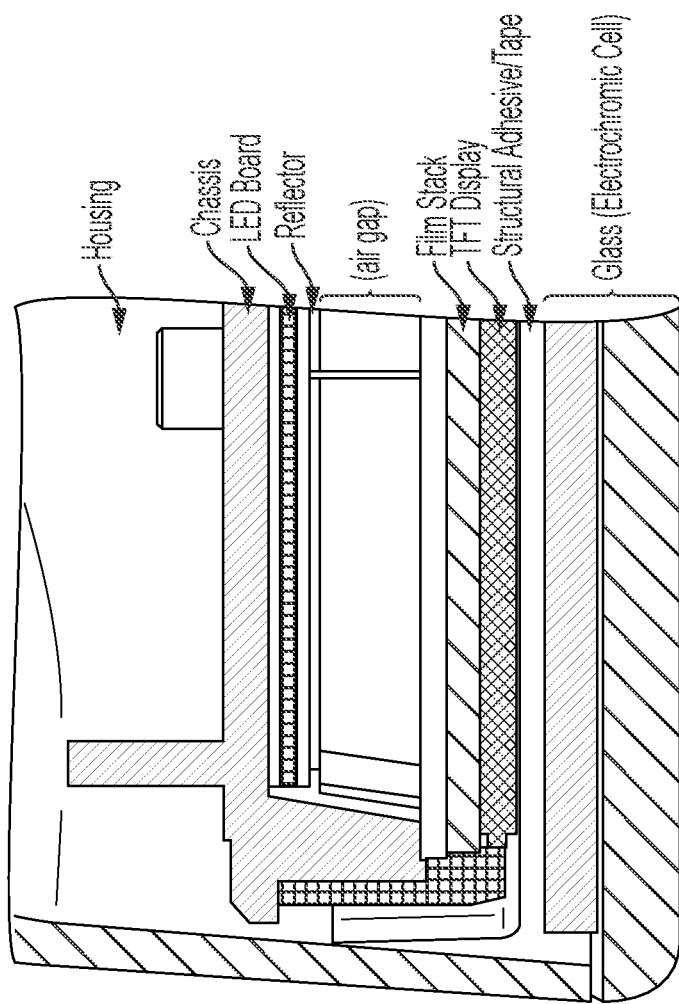
FIG. 3 is an enlarged sectional view of an interior rearview mirror assembly with a backlit TFT display.
Figure 4:
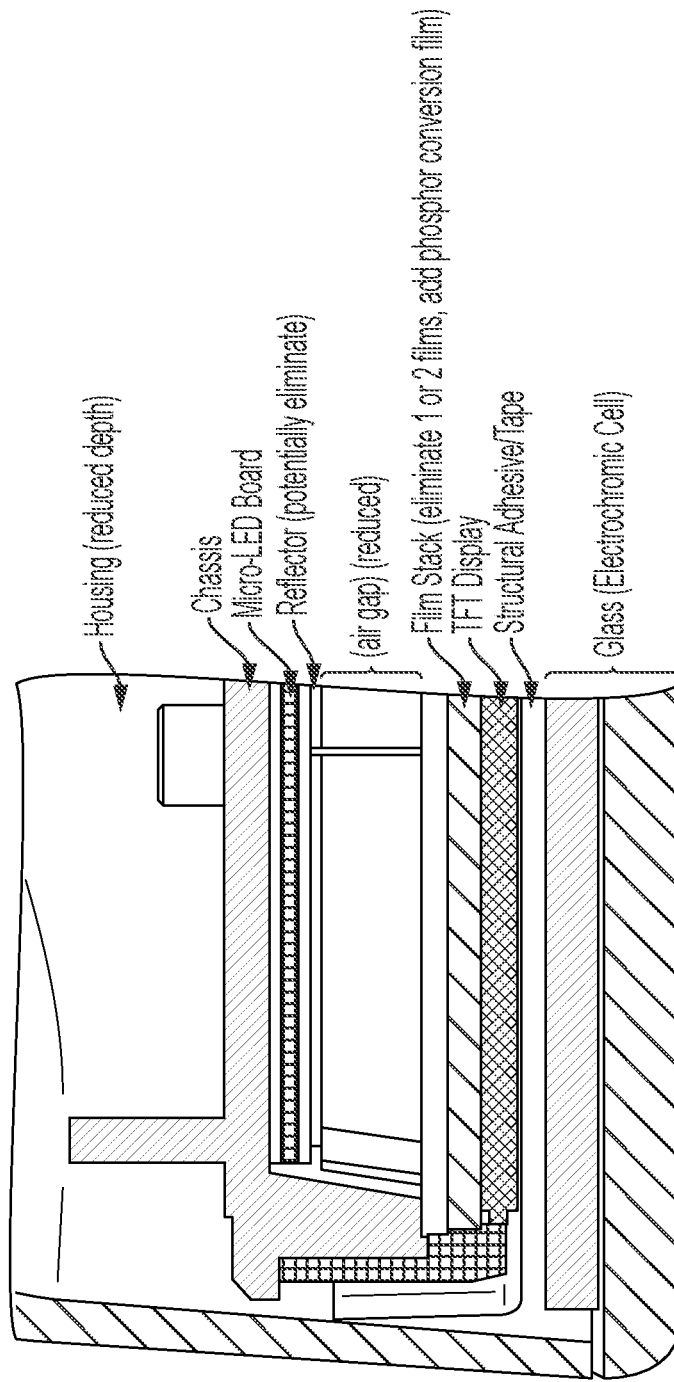
FIG. 4 is an enlarged sectional view of an interior rearview mirror assembly with a micro-LED backlit TFT display in accordance with the present invention.
Figure 5:
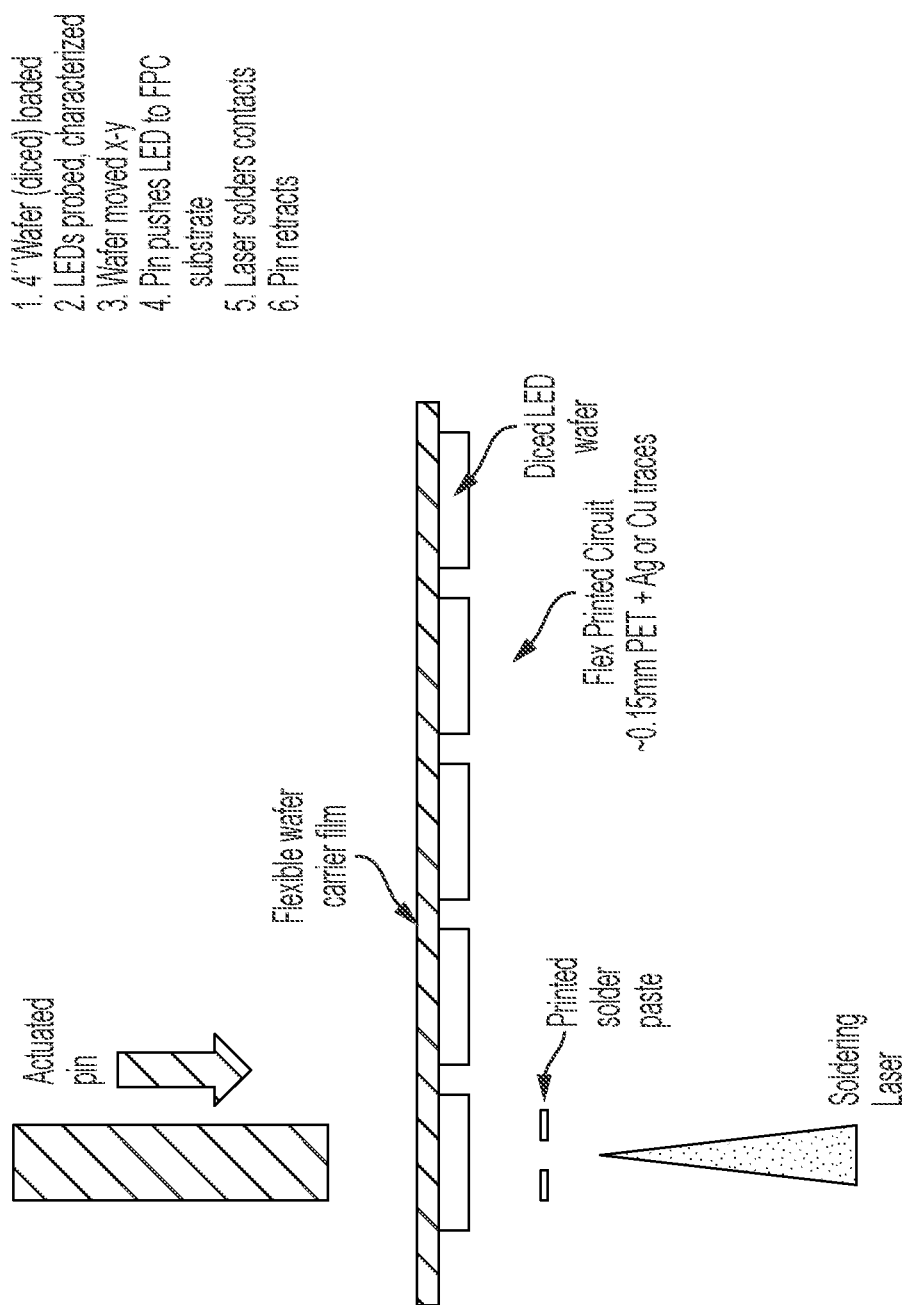
FIG. 5 is a schematic showing the manufacturing system for a micro-LED backlight of the full mirror display of the present invention.

Because most of the depth of the display device is driven by the backlight thickness, a significant depth reduction can be achieved by reducing the thickness of the backlight. As can be seen by comparing FIG. 3 with FIG. 4, the micro-LED board (FIG. 4) of the display device of the mirror assembly of the present invention allows for reduction of an air gap to no more than 3 mm, preferably less than 2.5 mm (and no smaller than about 0.5 mm), and may allow for elimination of reflector/diffuser films used in conjunction with backlighting, and thus allows for elimination of one or two films or layers of the film stack at the TFT display.

For the interior rearview mirror assembly 10 that includes the video screen element 14, an array of at least around 1,600 blue micro-LEDs has a phosphor conversion film disposed thereover, so that white light backlighting is provided at the video screen element. Thus, the present invention provides a full mirror display having reduced thickness and brighter output and enhanced uniformity of the backlighting, with reduced current draw and heat dissipation. The display thus may have a reduced thickness and reduced volume as compared to conventional displays and may operate with substantially reduced power consumption as compared to conventional displays.

The display device is operable to display video images captured by a rearward viewing camera, such as a camera mounted at a rear, front, side or roof exterior portion of the vehicle or that views from the interior cabin through a rear window of the vehicle so as to have a rearward field of view rearward and at least partially sideward of the vehicle. The camera may capture images during normal operation of the vehicle, such as when the driver of the vehicle drives the vehicle forwardly along a road. Video images are displayed by the display device during such normal operation, such as to provide enhanced rearward viewing that encompasses regions not viewable to a driver of a vehicle viewing a conventional interior rearview mirror assembly. The display device may also display other information to the driver, such as advanced driver assistance system (ADAS) information or the like, such as via text or images or icons or indicia displayed at or over or instead of the video images, depending on the particular situation and desired display appearance. Optionally, the system may determine that the mirror head is not adjusted for proper rearward viewing or for viewing of displayed images, and the display device may display a message (such as text or indicia or the like) to alert the driver to adjust the angle of the mirror head for optimum or enhanced viewing by the driver.

Figure 6:
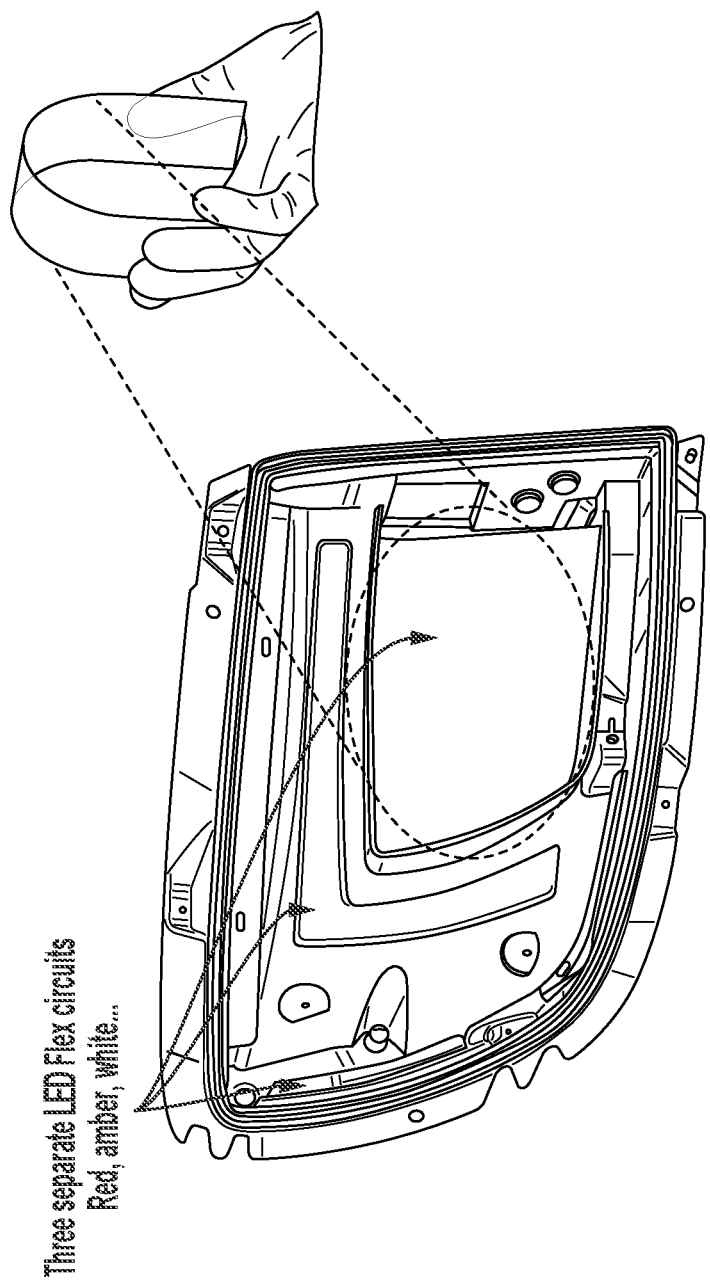
FIG. 6 is a view of a tail light assembly for a vehicle, with flexible circuit micro-LED light sources that provide red light, amber light and white light, respectively.

Although shown and described as being part of a display device of an interior rearview mirror assembly, aspects of the backlighting device and display of the present invention are suitable for other vehicle applications. For example, and such as shown in FIG. 6, a micro-LED array of light emitting diodes may be disposed at a flexible circuit element, which may be cut or formed to provide various lighting functions, such as a brake light, a rear backup light, and/or a turn signal indicator, and/or map lighting and/or accent or mood lighting. Optionally, such a micro-LED light array may be disposed at an exterior rearview mirror assembly to provide a turn signal indicator, ground illumination or the like. Such a micro-LED array light source or device allows for a lower profile lighting assembly and provides for optional shapes and styling of the vehicle light assemblies. Optionally, such a micro-LED light array may be disposed at an interior rearview mirror assembly to provide map lighting.

For example, the entire light assembly may be around 1-3 mm thick, with a Poly-methyl-methacrylate (PMMA) outer injection molded or thermoformed shape. The LED array or sheet may be laminated with the driver circuit integrated thereat. The LED array or sheet may be made flat and folded or thermoformed to the desired shape. For example, the PMMA inside may be printed with graphics, metallized, or the like for the desired styling and/or color. The micro-LEDs may only be visible when activated (whereby the outer casing of the light assembly may hide the micro-LEDs from view when not activated or energized. Optionally, the micro-LED flex circuit insert may be molded into a part, and the part may be metallized or have a graphic print or mask through painting.

Optionally, the micro-LEDs may comprise colored micro-LEDs (such as red, green and blue micro-LEDs) mounted at a flexible circuit to provide a color display. The micro-LED array may be laminated or insert molded into a product. Optionally, the micro-LED array may provide a curved liquid crystal display or may be three dimensionally shaped. Optionally, the display or graphic that is backlit by the micro-LED array may comprise a printed graphic film, with the micro-LEDs surface mounted thereat, and may include sensors (such as capacitive sensors or touch sensors or the like) and/or antennas established thereat.

Thus, the mirror display or automotive lighting device of the present invention provides a high density micro-LED light source on a flexible substrate. The device may be pixelated, and provides the potential to pixelate RGB micro-LEDs for a display. The closely spaced micro-LEDs operate in a similar manner as known larger OLEDs, but may provide more uniform lighting and greater efficiency and reduced heat and reduced cost.

The present invention thus provides a backlighting micro-LED board for a full mirror display at an interior rearview mirror assembly of a vehicle. This would replace the standard FR4 and micro-LED board with a much larger number of micro-LEDs providing the benefits discussed above. Optionally, there are other applications as well for exterior rearview mirrors and door handles, such as, for example, video mirror backlights (providing thinner, improved uniformity and efficiency of the system), turn signals indicators (at exterior rearview mirrors, providing some unique aesthetics), blind zone indicators (BZIs, allowing for thinner modules), door handle strip lights, and/or trailer-tow mirror clearance lamps and/or the like.

The micro-LED lighting device of the present invention is suitable for various automotive lighting applications, including, for example, display screen backlighting [such as by utilizing aspects of the systems described in U.S. Pat. Nos. 9,487,144; 7,855,755; 7,338,177; 7,195,381 and/or 6,690,268 (which are hereby incorporated herein by reference in their entireties)], blind zone indication [such as by utilizing aspects of the systems described in U.S. Pat. Nos. 9,659,498; 7,581,859 and/or 6,919,796 (which are hereby incorporated herein by reference in their entireties)], exterior mirror lighting [such as by utilizing aspects of the systems described in U.S. Pat. Nos. 8,764,256; 8,696,179; 8,058,977; 7,944,371 (which are hereby incorporated herein by reference in their entireties)], interior mirror lighting [such as by utilizing aspects of the systems described in U.S. Pat. Nos. 7,195,381 and/or 6,690,268 (which are hereby incorporated herein by reference in their entireties)], exterior lighting [such as by utilizing aspects of the systems described in U.S. Pat. Nos. 9,290,970; 8,786,401; 8,376,595; 8,333,492; 8,142,059 and/or 6,445,287 (which are hereby incorporated herein by reference in their entireties)] and interior cabin lighting [such as by utilizing aspects of the systems described in U.S. Pat. Nos. 9,280,202; 9,126,525; 8,367,844; 6,568,839; 6,416,208; 6,280,069; 6,276,821; 6,176,602; 6,152,590; 6,149,287; 6,139,172; 6,086,229; 5,938,321; 5,671,996 and/or 5,497,305, and/or U.S. Publication No. US-2017-0217367 (which are hereby incorporated herein by reference in their entireties)].

The display device may be disposed behind an electro-optic reflective element and is operable to display images and information for viewing by the driver of the vehicle through the transflective mirror reflector coating. The display area of the display screen is sized to substantially encompass the electro-optically active region (the region bounded by the perimeter seal) of the mirror reflective element. The display device may utilize aspects of the display-on-demand transflective type displays and/or video displays or display screens of the types disclosed in U.S. Pat. Nos. 8,890,955; 7,855,755; 7,338,177; 7,274,501; 7,255,451; 7,195,381; 7,184,190; 7,046,448; 5,668,663; 5,724,187; 5,530,240; 6,329,925; 6,690,268; 7,734,392; 7,370,983; 6,902,284; 6,428,172; 6,420,975; 5,416,313; 5,285,060; 5,193,029 and/or 4,793,690, and/or in U.S. Pat. Pub. Nos. US-2006-0050018; US-2009-0015736; US-2009-0015736 and/or US-2010-0097469, which are all hereby incorporated herein by reference in their entireties.

As discussed above, the mirror assembly may comprise an electro-optic or electrochromic mirror assembly that includes an electro-optic or electrochromic reflective element. The perimeter edges of the reflective element may be encased or encompassed by the perimeter element or portion of the bezel portion to conceal and contain and envelop the perimeter edges of the substrates and the perimeter seal disposed therebetween. The electrochromic mirror element of the electrochromic mirror assembly may utilize the principles disclosed in commonly assigned U.S. Pat. Nos. 7,274,501; 7,255,451; 7,195,381; 7,184,190; 6,690,268; 5,140,455; 5,151,816; 6,178,034; 6,154,306; 6,002,544; 5,567,360; 5,525,264; 5,610,756; 5,406,414; 5,253,109; 5,076,673; 5,073,012; 5,117,346; 5,724,187; 5,668,663; 5,910,854; 5,142,407 and/or 4,712,879, which are hereby incorporated herein by reference in their entireties.

Although shown as an electrochromic mirror application, it is envisioned that the mirror assembly may comprise a prismatic or flat glass reflective element, while remaining within the spirit and scope of the present invention. For example, the full display mirror may comprise a fixed reflectance or non-electro-optic reflective element, such as a flat or planar glass reflective element or the like, with a transflective mirror reflector disposed at a rear surface of the reflective element. The reflective element may comprise a thin chrome layer and may comprise a dielectric mirror that is transparent and reflective, such as, for example, at least about 35 percent reflective (such as, for example, about 42 percent reflective or thereabouts). Optionally, the second surface of the LCD display screen may comprise a reflector to enhance reflectance of the mirror reflective element. Optionally, the front glass at the LCD display screen may comprise Gorilla glass or other suitably durable and thin and strong glass substrate.

By being disposed on a flexible polymeric substrate, micro-LED lighting may be provided on a curved or non-planar surface, such as by conforming the micro-LED flexible film to that curved surface, preferably using techniques such as thermal forming or vacuum bagging with thermal assistance to achieve conformance or the like. For example, lighting may be applied at the outside surface of a plastic mirror casing for an exterior mirror or at a surface of an interior or exterior door handle of a vehicle or the like.

Optionally, for example, the reflective element may comprise a prismatic reflective element, and the prismatic mirror assembly may be mounted or attached at an interior portion of a vehicle (such as at an interior surface of a vehicle windshield) via any suitable mounting means, and the reflective element may be toggled or flipped or adjusted between its daytime reflectivity position and its nighttime reflectivity position via any suitable toggle means, such as by utilizing aspects of the mirror assemblies described in U.S. Pat. Nos. 6,318,870 and/or 7,249,860, and/or U.S. Publication No. US-2010-0085653, which are hereby incorporated herein by reference in their entireties. Optionally, for example, the interior rearview mirror assembly may comprise a prismatic mirror assembly, such as the types described in U.S. Pat. Nos. 7,420,756; 7,289,037; 7,274,501; 7,249,860; 7,338,177 7,255,451; 7,289,037; 7,249,860; 6,318,870; 6,598,980; 5,327,288; 4,948,242; 4,826,289; 4,436,371 and/or 4,435,042, which are hereby incorporated herein by reference in their entireties. A variety of mirror accessories and constructions are known in the art, such as those disclosed in U.S. Pat. Nos. 5,555,136; 5,582,383; 5,680,263; 5,984,482; 6,227,675; 6,229,319 and/or 6,315,421 (which are hereby incorporated herein by reference in their entireties), that can benefit from the present invention.

Aspects of the display device and mirror reflective element construction of the present invention may also be used in video mirrors such as those described in U.S. Pat. No. 9,057,875 and/or U.S. Publication No. US-2014-0347488, which are hereby incorporated by reference herein in their entireties. In such video mirrors that utilize a full-screen or near full-screen video display, an actuator device may be adjustable to tilt a mirrored glass element in one direction, thereby moving the mirrored glass element to an off-axis position which approximately simultaneously changes the on/off state of a video display module. The actuator device is also adjustable to tilt the glass element in another direction, thereby moving the glass element to an on-axis position which approximately simultaneously changes the on/off state of the display module. The mirror assembly and display and adjustment may utilize aspects of the mirror assemblies described in U.S. Pat. No. 9,205,780, which is hereby incorporated herein by reference in its entirety.

The mirror assembly may comprise any suitable construction, such as, for example, a mirror assembly with the reflective element being nested in the mirror casing and with a bezel portion that circumscribes a perimeter region of the front surface of the reflective element, or with the mirror casing having a curved or beveled perimeter edge around the reflective element and with no overlap onto the front surface of the reflective element (such as by utilizing aspects of the mirror assemblies described in U.S. Pat. Nos. 7,255,451; 7,289,037; 7,360,932; 8,049,640; 8,277,059 and/or 8,529,108, or such as a mirror assembly having a rear substrate of an electro-optic or electrochromic reflective element nested in the mirror casing, and with the front substrate having curved or beveled perimeter edges, or such as a mirror assembly having a prismatic reflective element that is disposed at an outer perimeter edge of the mirror casing and with the prismatic substrate having curved or beveled perimeter edges, such as described in U.S. Pat. Nos. 8,508,831; 8,730,553; 9,598,016 and/or 9,346,403, and/or U.S. Publication Nos. US-2014-0313563 and/or US-2015-0097955, which are hereby incorporated herein by reference in their entireties (and with electrochromic and prismatic mirrors of such construction are commercially available from the assignee of this application under the trade name INFINITY™ mirror).

Changes and modifications in the specifically described embodiments may be carried out without departing from the principles of the present invention, which is intended to be limited only by the scope of the appended claims as interpreted according to the principles of patent law.

The invention claimed is:

1. A vehicular interior rearview mirror assembly, said vehicular interior rearview mirror assembly comprising:
    a mirror head pivotable about a mirror support;
    wherein said mirror support is configured to attach at an interior portion of a vehicle equipped with said vehicular interior rearview mirror assembly;
    wherein said mirror head comprises a mirror casing and a mirror reflective element having a transflective mirror reflector that at least partially reflects light incident thereon and at least partially transmits incident light therethrough;
    wherein said mirror reflective element comprises a reflective region defined by said transflective mirror reflector that is viewable by a driver of the equipped vehicle viewing said mirror reflective element;
    a video display device disposed behind said mirror reflective element, wherein said video display device comprises a display screen that occupies at least 75 percent of said reflective region of said mirror reflective element;
    wherein said display screen is backlit by a backlighting device, and wherein said backlighting device comprises a plurality of micro-LEDs disposed at a flexible circuit element;
    wherein said micro-LEDs are disposed at electrically conductive traces of said flexible circuit element;
    wherein a width dimension of individual micro-LEDs of said plurality of micro-LEDs is less than 500 microns, and wherein a length dimension of individual micro-LEDs of said plurality of micro-LEDs is less than 500 microns;
    wherein packing density of micro-LEDs of said plurality of micro-LEDs at said flexible circuit element is at least 10 micro-LEDs per square centimeter;
    wherein current passed by individual micro-LEDs of said plurality of micro-LEDs when operated is less than 4 mA;
    wherein said display screen and said backlighting device are disposed within said mirror casing;
    wherein, with said mirror support attached at the interior portion of the equipped vehicle, said video display device is operable to display video images captured by a camera of the equipped vehicle; and
    wherein, when said video display device is operated to display video images, light emitted by said video display device passes through said mirror reflective element for viewing of displayed video images by the driver of the equipped vehicle viewing said mirror reflective element.

2. The vehicular interior rearview mirror assembly of claim 1, wherein said flexible circuit element comprises a flexible polyimide film.

3. The vehicular interior rearview mirror assembly of claim 1, wherein said flexible circuit element comprises a flexible polyethylene terephthalate film.

4. The vehicular interior rearview mirror assembly of claim 1, wherein said plurality of micro-LEDs comprises at least 1,300 micro-LEDs disposed at said flexible circuit element.

5. The vehicular interior rearview mirror assembly of claim 1, wherein the width dimension of individual micro-LEDs of said plurality of micro-LEDs is greater than 75 microns, and wherein the length dimension of individual micro-LEDs of said plurality of micro-LEDs is greater than 75 microns.

6. The vehicular interior rearview mirror assembly of claim 1, wherein said micro-LEDs are disposed at printed silver traces of said flexible circuit element.

7. The vehicular interior rearview mirror assembly of claim 1, wherein said micro-LEDs are disposed at copper traces of said flexible circuit element.

8. The vehicular interior rearview mirror assembly of claim 1, wherein the packing density of micro-LEDs of said plurality of micro-LEDs at said flexible circuit element is at least 20 micro-LEDs per square centimeter.

9. The vehicular interior rearview mirror assembly of claim 1, wherein the packing density of micro-LEDs of said plurality of micro-LEDs at said flexible circuit element is at least 30 micro-LEDs per square centimeter.

10. The vehicular interior rearview mirror assembly of claim 1, wherein said display screen comprises a diffuser.

11. The vehicular interior rearview mirror assembly of claim 10, wherein the diffuser comprises a plurality of layers of diffuser film, and wherein at least one layer of the plurality of layers of diffuser film comprises a phosphor conversion film.

12. The vehicular interior rearview mirror assembly of claim 1, wherein said display screen and said backlighting device are at least partially supported at a chassis within said mirror casing, and wherein said chassis comprises a rear wall and side walls extending from the rear wall, and wherein said backlighting device is disposed at the rear wall of said chassis and said display screen is disposed in front of said backlighting device and spaced from said backlighting device.

13. The vehicular interior rearview mirror assembly of claim 1, wherein said mirror reflective element comprises a single glass substrate having said transflective mirror reflector disposed at a rear surface of said single glass substrate.

14. The vehicular interior rearview mirror assembly of claim 1, wherein said mirror reflective element comprises an electro-optic mirror reflective element having a front substrate and a rear substrate with an electro-optic medium disposed therebetween, and wherein said front substrate has a first surface and a second surface and said rear substrate has a third surface and a fourth surface, said second surface and said third surface opposing said electro-optic medium, and wherein said transflective mirror reflector is disposed at said third surface.

15. The vehicular interior rearview mirror assembly of claim 1, wherein current passed by individual micro-LEDs of said plurality of micro-LEDs when operated is greater than 0.75 mA.

16. The vehicular interior rearview mirror assembly of claim 1, wherein current passed by individual micro-LEDs of said plurality of micro-LEDs when operated is greater than 1 mA and less than 2.5 mA.

17. The vehicular interior rearview mirror assembly of claim 1, wherein current passed by individual micro-LEDs of said plurality of micro-LEDs when operated is greater than 1.25 mA and less than 1.75 mA.

18. The vehicular interior rearview mirror assembly of claim 1, wherein the interior portion of the equipped vehicle comprises an in-cabin side of a windshield of the equipped vehicle.

19. A vehicular interior rearview mirror assembly, said vehicular interior rearview mirror assembly comprising:
   a mirror head pivotable about a mirror support;
   wherein said mirror support is configured to attach at an interior portion of a vehicle equipped with said vehicular interior rearview mirror assembly;
   wherein said mirror head comprises a mirror casing and a mirror reflective element having a transflective mirror reflector that at least partially reflects light incident thereon and at least partially transmits incident light therethrough;
   wherein said mirror reflective element comprises a reflective region defined by said transflective mirror reflector that is viewable by a driver of the equipped vehicle viewing said mirror reflective element;
   a video display device disposed behind said mirror reflective element, wherein said video display device comprises a display screen that occupies at least 75 percent of said reflective region of said mirror reflective element;
   wherein said display screen is backlit by a backlighting device, and wherein said backlighting device comprises a plurality of micro-LEDs disposed at a flexible circuit element;
   wherein said plurality of micro-LEDs comprises at least 1,300 micro-LEDs disposed at said flexible circuit element;
   wherein said micro-LEDs are disposed at electrically conductive traces of said flexible circuit element;
   wherein a width dimension of individual micro-LEDs of said plurality of micro-LEDs is greater than 75 microns and is less than 500 microns, and wherein a length dimension of individual micro-LEDs of said plurality of micro-LEDs is greater than 75 microns and is less than 500 microns;
   wherein packing density of micro-LEDs of said plurality of micro-LEDs at said flexible circuit element is at least 10 micro-LEDs per square centimeter;
   wherein current passed by individual micro-LEDs of said plurality of micro-LEDs when operated is less than 4 mA;
   wherein said display screen and said backlighting device are disposed within said mirror casing;
   wherein, with said mirror support attached at the interior portion of the equipped vehicle, said video display device is operable to display video images captured by a camera of the equipped vehicle; and
   wherein, when said video display device is operated to display video images, light emitted by said video display device passes through said mirror reflective element for viewing of displayed video images by the driver of the equipped vehicle viewing said mirror reflective element.

20. The vehicular interior rearview mirror assembly of claim 19, wherein said flexible circuit element comprises a flexible polyimide film.

21. The vehicular interior rearview mirror assembly of claim 19, wherein the packing density of micro-LEDs of said plurality of micro-LEDs at said flexible circuit element is at least 20 micro-LEDs per square centimeter.

22. The vehicular interior rearview mirror assembly of claim 19, wherein the packing density of micro-LEDs of said plurality of micro-LEDs at said flexible circuit element is at least 30 micro-LEDs per square centimeter.

23. The vehicular interior rearview mirror assembly of claim 19, wherein said display screen and said backlighting device are at least partially supported at a chassis within said mirror casing, and wherein said chassis comprises a rear wall and side walls extending from the rear wall, and wherein said backlighting device is disposed at the rear wall of said chassis and said display screen is disposed in front of said backlighting device and spaced from said backlighting device.

24. The vehicular interior rearview mirror assembly of claim 19, wherein the interior portion of the equipped vehicle comprises an in-cabin side of a windshield of the equipped vehicle.

25. A vehicular interior rearview mirror assembly, said vehicular interior rearview mirror assembly comprising:
a mirror head pivotable about a mirror support;
wherein said mirror support is configured to attach at an interior portion of a vehicle equipped with said vehicular interior rearview mirror assembly;
wherein said mirror head comprises a mirror casing and a mirror reflective element having a transflective mirror reflector that at least partially reflects light incident thereon and at least partially transmits incident light therethrough;
wherein said mirror reflective element comprises a reflective region defined by said transflective mirror reflector that is viewable by a driver of the equipped vehicle viewing said mirror reflective element;
a video display device disposed behind said mirror reflective element, wherein said video display device comprises a display screen that occupies at least 75 percent of said reflective region of said mirror reflective element;
wherein said display screen is backlit by a backlighting device, and wherein said backlighting device comprises a plurality of micro-LEDs disposed at a flexible circuit element;
wherein said micro-LEDs are disposed at electrically conductive traces of said flexible circuit element;
wherein packing density of micro-LEDs of said plurality of micro-LEDs at said flexible circuit element is at least 10 micro-LEDs per square centimeter;
wherein current passed by individual micro-LEDs of said plurality of micro-LEDs when operated is greater than 0.75 mA and is less than 4 mA;
wherein said display screen and said backlighting device are disposed within said mirror casing;
wherein said display screen comprises a diffuser;
wherein, with said mirror support attached at the interior portion of the equipped vehicle, said video display device is operable to display video images captured by a camera of the equipped vehicle; and
wherein, when said video display device is operated to display video images, light emitted by said video display device passes through said mirror reflective element for viewing of displayed video images by the driver of the equipped vehicle viewing said mirror reflective element.

26. The vehicular interior rearview mirror assembly of claim 25, wherein the diffuser comprises a plurality of layers of diffuser film.

27. The vehicular interior rearview mirror assembly of claim 26, wherein at least one layer of the plurality of layers of diffuser film comprises a phosphor conversion film.

28. The vehicular interior rearview mirror assembly of claim 25, wherein said flexible circuit element comprises a flexible polyimide film.

29. The vehicular interior rearview mirror assembly of claim 25, wherein the packing density of micro-LEDs of said plurality of micro-LEDs at said flexible circuit element is at least 20 micro-LEDs per square centimeter.

30. The vehicular interior rearview mirror assembly of claim 25, wherein the packing density of micro-LEDs of said plurality of micro-LEDs at said flexible circuit element is at least 30 micro-LEDs per square centimeter.

31. The vehicular interior rearview mirror assembly of claim 30, wherein a width dimension of individual micro-LEDs of said plurality of micro-LEDs is less than 500 microns, and wherein a length dimension of individual micro-LEDs of said plurality of micro-LEDs is less than 500 microns.

32. The vehicular interior rearview mirror assembly of claim 25, wherein said display screen and said backlighting device are at least partially supported at a chassis within said mirror casing, and wherein said chassis comprises a rear wall and side walls extending from the rear wall, and wherein said backlighting device is disposed at the rear wall of said chassis and said display screen is disposed in front of said backlighting device and spaced from said backlighting device.

33. The vehicular interior rearview mirror assembly of claim 25, wherein current passed by individual micro-LEDs of said plurality of micro-LEDs when operated is greater than 1 mA and less than 2.5 mA.

34. The vehicular interior rearview mirror assembly of claim 25, wherein current passed by individual micro-LEDs of said plurality of micro-LEDs when operated is greater than 1.25 mA and less than 1.75 mA.

35. The vehicular interior rearview mirror assembly of claim 25, wherein the interior portion of the equipped vehicle comprises an in-cabin side of a windshield of the equipped vehicle.

\* \* \* \* \*